(12) United States Patent
Nakayama

(10) Patent No.: US 11,093,089 B2
(45) Date of Patent: Aug. 17, 2021

(54) TOUCH SENSOR AND TOUCH PANEL WITH TOUCH ELECTRODES AND INSULATING LAYER

(71) Applicant: FUJIFILM Corporation, Tokyo (JP)

(72) Inventor: Masaya Nakayama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/852,744

(22) Filed: Apr. 20, 2020

(65) Prior Publication Data

US 2020/0249782 A1 Aug. 6, 2020

Related U.S. Application Data

(63) Continuation of application No. PCT/JP2018/037288, filed on Oct. 4, 2018.

(30) Foreign Application Priority Data

Nov. 15, 2017 (JP) .............................. JP2017-220090

(51) Int. Cl.
*G06F 3/044* (2006.01)
*H05K 1/03* (2006.01)

(52) U.S. Cl.
CPC ........... *G06F 3/044* (2013.01); *H05K 1/0306* (2013.01); *G06F 2203/04112* (2013.01)

(58) Field of Classification Search
CPC ........... G06F 3/044; G06F 2203/04112; H05K 1/0306
See application file for complete search history.

(56) References Cited

U.S. PATENT DOCUMENTS

| | | | |
|---|---|---|---|
| 2009/0197088 A1* | 8/2009 | Murata | H01L 31/048 428/410 |
| 2015/0015802 A1* | 1/2015 | Jeon | G06F 3/0445 349/12 |
| 2015/0205406 A1* | 7/2015 | Zhou | G06F 3/0445 345/174 |

(Continued)

FOREIGN PATENT DOCUMENTS

| | | |
|---|---|---|
| JP | 09-301732 A | 11/1997 |
| JP | 2009-057271 A | 3/2009 |

(Continued)

OTHER PUBLICATIONS

International Search Report Issued in PCT/JP2018/037288 dated Dec. 25, 2018.

(Continued)

*Primary Examiner* — Lisa S Landis
(74) *Attorney, Agent, or Firm* — Edwards Neils LLC; Jean C. Edwards, Esq.

(57) ABSTRACT

A touch sensor includes a glass substrate having a touch surface and a first touch electrode formed of a fine metal wire formed on a surface of the glass substrate opposite to the touch surface, the glass substrate contains an Si atom, an Al atom, and a K atom, a content of the Si atom is 25.0% to 35.0% by mass with respect to the total mass of the glass substrate, a content of the Al atom is 5.0% to 16.0% by mass with respect to the total mass of the glass substrate, and a content of the K atom is 3.0% to 10.0% by mass with respect to the total mass of the glass substrate.

16 Claims, 3 Drawing Sheets

(56) References Cited

U.S. PATENT DOCUMENTS

2018/0113347 A1    4/2018   Hara et al.
2018/0297341 A1   10/2018   Ueki et al.
2019/0187841 A1*   6/2019   Kuwabara ................. B32B 7/12

FOREIGN PATENT DOCUMENTS

| JP | 2010-116276 A | 5/2010 |
| JP | 2015-018532 A | 1/2015 |
| JP | 2017-037509 A | 2/2017 |
| JP | 2017-198963 A | 11/2017 |
| WO | 2017/017973 A1 | 2/2017 |

OTHER PUBLICATIONS

Written Opinion Issued in PCT/JP2018/037288 dated Dec. 25, 2018.
International Preliminary Report on Patentability Issued in PCT/JP2018/037288 dated May 19, 2020.
Office Action, issued by the Japanese Patent Office dated May 11, 2021, in connection with Japanese Patent Application No. 2019-553737.

* cited by examiner

TOUCH SENSOR AND TOUCH PANEL WITH TOUCH ELECTRODES AND INSULATING LAYER

CROSS-REFERENCE TO RELATED APPLICATIONS

This application is a Continuation of PCT International Application No. PCT/JP2018/037288 filed on Oct. 4, 2018, which was published under PCT Article 21(2) in Japanese, and which claims priority under 35 U.S.C § 119(a) to Japanese Patent Application No. 2017-220090 filed on Nov. 15, 2017. The above applications are hereby expressly incorporated by reference, in their entirety, into the present application.

BACKGROUND OF THE INVENTION

1. Field of the Invention

The present invention relates to a touch sensor and a touch panel.

2. Description of the Related Art

In recent years, touch panels which are used in combination with display devices such as a liquid crystal display device and perform an input operation to an electronic apparatus by coming to contact with or approach to a screen with a finger, a stylus pen, or the like in various electronic apparatuses including portable information apparatuses such as tablet-type computers and smartphones have come into wide use.

In the touch panel, a touch sensor in which a detection unit for detecting a touch operation by touching or approaching with a finger, a stylus pen, or the like has been formed is used.

The detection unit is formed of a transparent conductive oxide such as indium tin oxide (ITO), but is also formed of a fine metal wire, in addition to the transparent conductive oxide. Metals have advantages such as easier patterning, excellent flexibility, and lower resistance, as compared with the above-mentioned transparent conductive oxide, and therefore, copper, silver, or the like is used for a fine metal wire in a touch panel or the like.

JP2015-018532A describes "a touch sensor including a window glass substrate, bezels formed along the periphery of the window glass substrate, an insulating layer formed on the window glass substrate by being laminated or adhered while filling in between the bezels, and an electrode pattern formed on the insulating layer.

SUMMARY OF THE INVENTION

In a similar manner to the touch sensor of JP2015-018532A, a touch sensor including a glass substrate having a touch surface and a touch electrode formed of a fine metal wire formed on a surface of the glass substrate opposite to the touch surface is referred to as an one glass solution (OGS)-mode touch sensor. The present inventors have found that in the OGS-mode touch sensor, the sensitivity of the touch panel is not sufficient depending on the type of the glass substrate.

Therefore, an object of the present invention is to provide an OGS-mode touch sensor having excellent sensitivity. Further, another object of the present invention is to provide a touch panel.

The present inventors have conducted intensive studies to achieve the objects, and as a result, have found that the objects are achieved by the following configuration.

[1] A touch sensor comprising:
a glass substrate having a touch surface; and
a first touch electrode formed of a fine metal wire formed on a surface of the glass substrate opposite to the touch surface,
in which the glass substrate contains an Si atom, an Al atom, and a K atom, a content of the Si atom is 25.0% to 35.0% by mass with respect to a total mass of the glass substrate, a content of the Al atom is 5.0% to 16.0% by mass with respect to the total mass of the glass substrate, and a content of the K atom is 3.0% to 10.0% by mass with respect to the total mass of the glass substrate.

[2] The touch sensor according to [1],
in which the content of the Si atom is 28.0% to 33.0% by mass with respect to the total mass of the glass substrate, the content of the Al atom is 7.0% to 10.0% by mass with respect to the total mass of the glass substrate, and the content of the K atom is 6.0% to 9.0% by mass with respect to the total mass of the glass substrate.

[3] The touch sensor according to [1] or [2], further comprising a first organic insulating layer having a relative dielectric constant of 3.0 or more between the glass substrate and the first touch electrode.

[4] The touch sensor according to any one of [1] to [3], further comprising a second organic insulating layer on the first touch electrode, and a second touch electrode formed of a fine metal wire on the second organic insulating layer.

[5] The touch sensor according to any one of [1] to [4], in which the fine metal wire forms a mesh shape and a mesh pitch is 400 to 1,200 μm.

[6] A touch panel comprising the touch sensor according to any one of [1] to [5].

According to the present invention, it is possible to provide an OGS-mode touch sensor having excellent sensitivity. Further, according to the present invention, it is also possible to provide a touch panel.

DESCRIPTION OF THE PREFERRED EMBODIMENTS

Hereinafter, the present invention will be described in detail.

Hereinafter, the touch sensor and the touch panel according to the present invention will be described in detail, based on suitable embodiments shown in the accompanying drawings.

Furthermore, in the following, a notation "~ to ~" indicating a numerical range is intended to include the numerical values described on both sides. For example, an expression that "s is a numerical value t1 to a numerical value t2" means that a range of s is a range including the numerical value t1 and the numerical value t2, and denotes t1≤s≤t2 as expressed in mathematical symbols.

Unless otherwise specified, angles including "perpendicular", "parallel", and the like are intended to include an error range generally accepted in the technical field.

A term, "transparent", means that a total light transmittance is at least 40% or more, preferably 75% or more, more preferably 80% or more, and still more preferably 90% or more in the visible light in a wavelength range of 400 to 800 nm. The total light transmittance is measured using "plastic-a method for determining a total light transmittance and a total light reflectance" specified in JIS K 7375: 2008.

Figure 1:
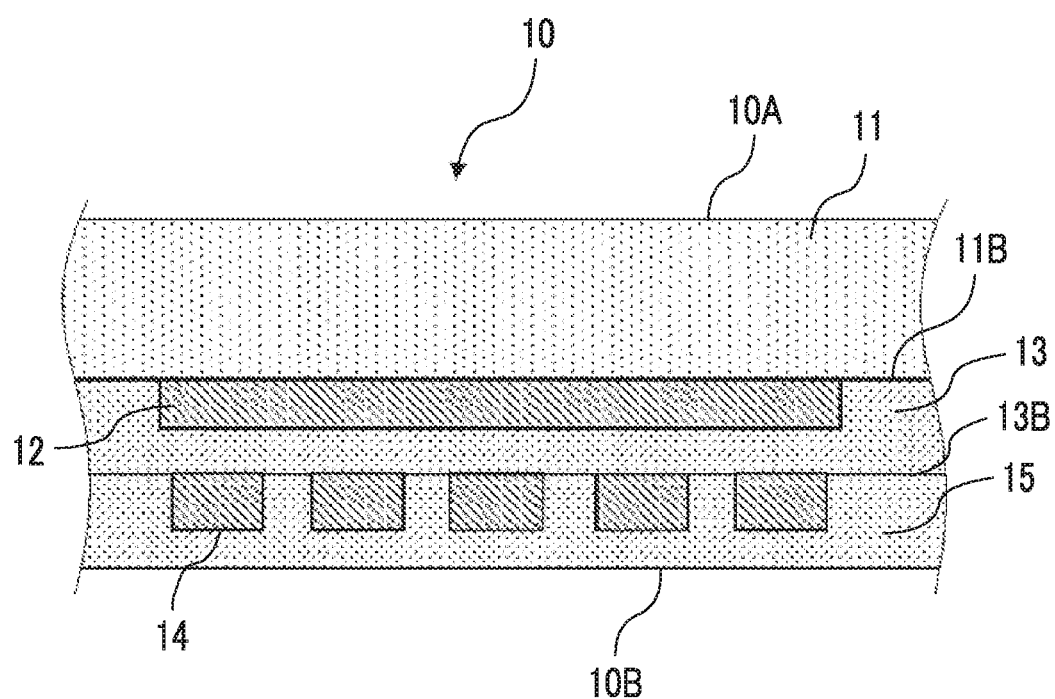
FIG. 1 is a schematic cross-sectional view of a touch sensor according to an embodiment of the present invention.

FIG. 1 shows a schematic cross-sectional view of a touch sensor 10 according to an embodiment of the present invention, and a configuration thereof will be described.

The touch sensor 10 has a front surface 10A and a back surface 10B, and is used in a state where a display device not shown in the drawing such as a liquid crystal display device and an organic electroluminescence display device is arranged on the back surface 10B side. The front surface 10A of the touch sensor 10 is a touch surface, in other words, a touch detection surface, and is a viewing side where an operator of the touch panel observes an image on the display device through the touch sensor 10. In addition, in the present specification, a touch panel refers to a device formed by connecting a driving electronic circuit (typically a flexible printed circuit hoard) to a touch sensor.

The touch sensor 10 has a transparent glass substrate 11 which is arranged on the front surface 10A side and has a flat plate shape; and has a plurality of first touch electrodes 12 formed on a surface 11B of the glass substrate 11 opposite to the front surface 10A (touch surface). Furthermore, a second organic insulating layer 13 is formed on the surface 11B of the glass substrate 11 so as to cover the first touch electrodes 12 for the purpose of flattening or protecting the first touch electrodes 12.

A plurality of second touch electrodes 14 are formed on a surface 13B of the second organic insulating layer 13 on the display device side. Furthermore, a protective layer 15 is arranged on the surface 13B of the second organic insulating layer 13 so as to cover the second touch electrodes 14 for the purpose of flattening or protecting the second touch electrodes 14.

In addition, the touch panel according to the embodiment of the present invention is not limited to the above, and may not include the second organic insulating layer 13, the second touch electrodes 14, and the protective layer 1.5.

Figure 2:
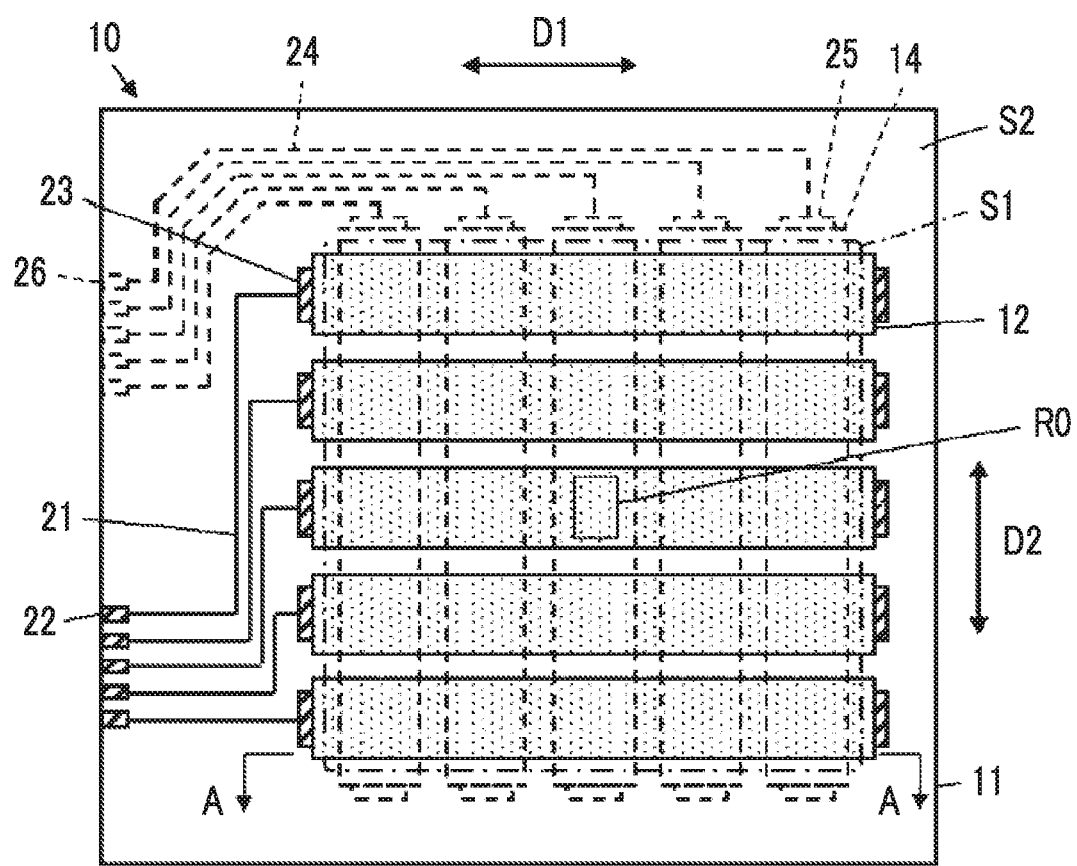
FIG. 2 is a plan view of the touch sensor according to the embodiment of the present invention.

As shown in FIG. 2, in the touch sensor 10, a transmissive region S1 is defined while a peripheral area S2 is defined outside the transmissive region S1.

The plurality of the first touch electrodes 12 formed on the surface 11B of the glass substrate 11 opposite to the touch surface each extend in the first direction D1 and are arranged in parallel in the second direction D2 orthogonal to the first direction D1.

The plurality of the second touch electrodes 14 formed on the plurality of the first touch electrodes 12 via the second organic insulating layer 13 each extend along the second direction D2 and are arranged in parallel in the first direction D1.

In the transmissive region S1, the first touch electrodes 12 formed on the surface 11B of the glass substrate 11 and the second touch electrodes 14 formed on the surface 13B of the second organic insulating layer 13 are arranged in intersection to overlap each other. In addition, the cross-sectional view of the touch sensor shown in FIG. 1 is a view corresponding to the A-A cross-section in the plan view of FIG. 2.

On the other hand, a plurality of first peripheral wirings 21 connected to the plurality of the first touch electrodes 12 are formed on the surface 11B of the glass substrate 11 in the peripheral region S2, and a plurality of first external connection terminals 22 are arranged and formed on the edge of the glass substrate 11 while a first connector unit 23 is formed at a terminal of each of the first touch electrodes 12. One terminal of the corresponding first peripheral wiring 21 is connected to the first connector unit 23, and the other terminal of the first peripheral wiring 21 is connected to the corresponding first external connection terminal Similarly, a plurality of second peripheral wirings 24 connected to the plurality of the second touch electrodes 14 are formed on the surface 13B of the second organic insulating layer 13 in the peripheral region S2, and a plurality of second external connection terminals 26 are arranged and formed on the edge of the second organic insulating layer 13 while a second connector unit 25 is formed at a terminal of each of the second touch electrodes 14. One terminal of the corresponding second peripheral wiring 24 is connected to the second connector unit 25, and the other terminal of the second peripheral wiring 24 is connected to the corresponding second external connection terminal 26.

Figure 3:
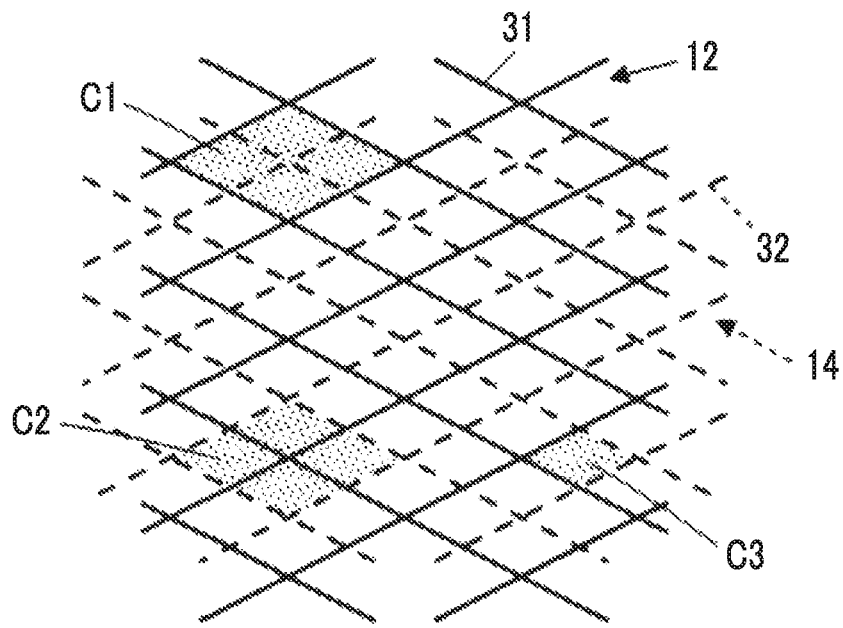
FIG. 3 is a partially enlarged view of intersections of a touch electrode in the touch sensor according to the embodiment of the present invention.

FIG. 3 shows intersections of the first touch electrodes 12 and the second touch electrodes 14 (a portion corresponding to R0 in FIG. 2). The first touch electrodes 12 formed on the surface 11B of the glass substrate 11 opposite to the touch surface are formed of first fine metal wires 31 and have a first mesh pattern having units of the first cells C1, and the second touch electrodes 14 formed on the surface 13B of the second organic insulating layer 13 are formed of second fine metal wires 32 and have a second mesh pattern in units of second cells C2. Further, at the intersections of the first touch electrodes 12 and the second touch electrodes 14, the first fine metal wires 31 and the second fine metal wires 32 are arranged so as to intersect each other as seen viewed from the viewing side. In addition, in FIG. 3, the second fine metal wires 32 are shown by a broken line in order to make clear distinctions between the first fine metal wires 31 and the second fine metal wires 32, but are actually formed with the connected metal wires in the same as the first fine metal wires 31.

The shapes of the first mesh pattern formed of the first fine metal wires 31 and the second mesh pattern formed of the second fine metal wires 32 are preferably patterns in which the same first cells C1 and second cells C2 as shown in FIG. 3 are repeatedly arranged, and the shapes of the first cells C1 and the second cells C2 are particularly preferably rhombus shapes, but may be a parallelogram, a square, a rectangle, or another polygon. For example, a mesh pitch represented by a distance between the centers of the two first cells C1 or second cells C2 adjacent in the first direction D1 is preferably 400 to 1,200 µm from the viewpoint of visibility and sensitivity of the touch sensor. It is preferable that the first cells C1 and the second cells C2 have the same shapes. Furthermore, as shown in FIG. 3, it is preferable from the viewpoint of visibility that the first mesh pattern formed of the first fine metal wires 31 and the second mesh pattern formed of the second fine metal wires 32 are displaced by a distance equivalent to a half of the mesh pitch, and both the mesh patterns are arranged and combined with each other to form a third mesh pattern having units of third cells C3 having a half mesh pitch as seen from the viewing side. In another aspect, the shape of the mesh may be a random pattern.

In addition, electrodes formed of the first fine metal wires 31 and the second fine metal wires 32, and dummy electrodes that are insulated may be each provided between the neighboring first touch electrodes 12 and between the neighboring second touch electrodes 14. The dummy electrodes preferably have a mesh pattern having the same shape as the mesh pattern of the first touch electrodes 12 and the second touch electrodes 14.

Figure 4:
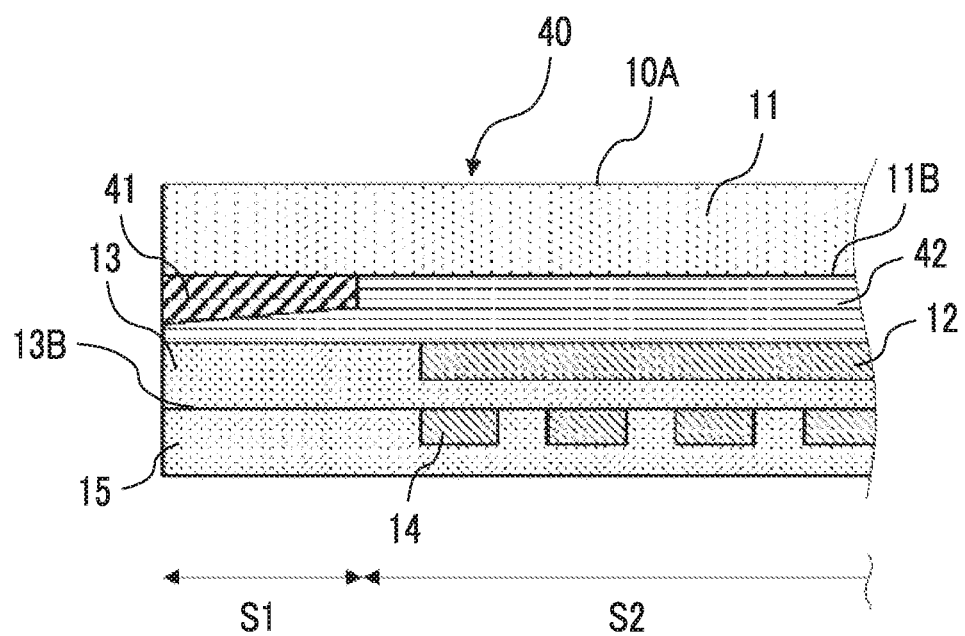
FIG. 4 is a schematic cross-sectional view of a modified example of the touch sensor according to the embodiment of the present invention.

FIG. 4 shows a modified example of the touch panel according to the embodiment of the present invention. The touch sensor 40 of FIG. 4 has a decorative layer 41 and a first organic insulating layer 42 on the surface 11B of the glass substrate 11. The decorative layer is arranged for the purpose of restricting transmission of visible light to be on the surface 11B of the glass substrate 11, and is arranged so as to surround the transmissive region S1 at a position corresponding to the peripheral region S2 in Table 2.

That is, in the touch sensor of the present embodiment, the first touch electrodes are usually formed directly or via the first organic insulating layer on the surface of the glass substrate opposite to the touch surface.

The first organic insulating layer 42 is arranged between the first touch electrodes 12 and the glass substrate 11, and is arranged to be charged or laminated on the surface 11B of the glass substrate 11 so as to fill in between the decorative layers 41 for the purpose of improving the insulating properties or of flattening. The other aspects are the same as described earlier and descriptions thereof will be omitted.

(Glass Substrate)

The glass substrate contains an Si atom, an Al atom, and a K atom (the three atoms are hereinafter collectively referred to as "specific atoms"). The glass substrate may contain an atom other than the specific atoms and examples of the atom other than the specific atoms include an O atom and an Na atom.

The content of the Si atom with respect to the total mass of the glass substrate is 25.0% to 35.0% by mass, and preferably 28.0% to 33.0% by mass, with respect to the total mass of the glass substrate.

The content of the Al atom with respect to the total mass of the glass substrate is 5.0% to 16.0% by mass, and preferably 7.0% to 10.0% by mass, with respect to the total mass of the glass substrate.

The content of the K atom with respect to the total mass of the glass substrate is 3.0% to 10.0% by mass, and preferably 6.0% to 9.0% by mass, with respect to the total mass of the glass substrate.

In a case where the content of the specific atoms is within the range, the touch panel marvelously has excellent sensitivity. In addition, the content of the specific atoms in the glass substrate can be measured by X-ray fluorescence (XRF).

The glass used for the glass substrate is not particularly limited as long as the content of the specific atoms is within the range, and examples thereof include tempered glass such as chemically strengthened glass and physically strengthened glass, soda lime glass, and non-alkali glass.

The thickness of the glass substrate is not particularly limited, but is generally preferably 0.3 to 1.5 mm.

The total light transmittance of the glass substrate is preferably 40% to 100%. The total light transmittance is measured using, for example, "Plastics—Determination of total luminous transmittance and reflectance" specified in JIS K7375: 2008.

(Fine Metal Wire)

The fine metal wire is not particularly limited as long as it is a material having conductivity, Examples of the material of the fine metal wire include copper, aluminum, gold, silver, titanium, palladium, chromium, nickel, and combinations thereof.

In addition, metal silver formed by exposing/developing a silver salt emulsion layer may be used as the fine metal wire.

The fine metal wire may be formed from a laminate. Examples of the laminate include a laminate having a three-layer structure of Mo/Al/Mo (a laminate called a so-called "MAM"), a laminate having a three-layer structure of Mo—NB alloy/Al/Mo—NB alloy, and a laminate having a three-layer structure of Mo—NB alloy/Al—Nb alloy/Mo—NB Furthermore, a laminate having a three-layer structure of Mo/Cu/Mo, a laminate having a three-layer structure of Mo—NB alloy/Cu/Mo—NB alloy, and a laminate having a three-layer structure of Mo—NB alloy/Cu alloy/Mo—NB alloy, in which Al of the above-described laminate is changed to Cu, can also be used. From the viewpoint of the sensitivity of the touch sensor, it is preferable to use Cu or a Cu alloy having low electric resistivity.

The thickness of the fine metal wire is not particularly limited, but a thin film having a thickness of 0.3 to 0.5 μm is generally preferable from the viewpoint of visibility.

The width of the fine metal wire is not particularly limited, but is generally preferably 0.5 to 10 μm, and particularly preferably 1.5 to 3 μm from the viewpoint of conductivity and visibility.

In order to improve the visibility of the fine metal wire, a blackening layer may be formed at least on the viewing side of the fine metal wire. As the material of the blackening layer, a metal oxide, a metal nitride, a metal oxynitride, a metal sulfide, or the like is used, and typically, copper oxynitride, copper nitride, copper oxide, molybdenum oxide, or the like can be used.

In a case where the fine metal wire forms a mesh shape, the mesh pitch of the fine metal wire is not particularly limited, and is preferably 400 to 1,200 μm from the viewpoint of the sensitivity and the visibility of the touch sensor. In particular, from the viewpoint of the sensitivity of the touch sensor, the thickness is preferably 500 μm or more.

(First Organic Insulating Layer and Second Organic Insulating Layer)

The first organic insulating layer is formed of an organic compound, and is not particularly limited in terms of a material therefor as long as it has sufficient transparency and insulating properties. Examples of the material of the first organic insulating layer include an epoxy resin and an acrylic resin.

Incidentally, the total light transmittance of the first organic insulating layer is preferably 40 to 100%. Further, the relative dielectric constant of the first organic insulating layer is preferably 3.0 or more, and more preferably 4.0 or more. From the viewpoint of the sensitivity of the touch sensor, in a case where the film thickness of the first organic insulating layer is 5 μm or more, the relative dielectric constant is more preferably 4.0 or more.

The thickness of the first organic insulating layer is not particularly limited, and it is generally preferably 1 to 20 μm, more preferably 3 to 10 μm. In general, the thickness of the first organic insulating layer is preferably more than the thickness of the decorative layer in order to flatten level differences of the decorative layer. The thickness of the decorative layer is preferably 0.5 to 3 μm.

In addition, the same material as that of the first organic insulating layer can be used for the second organic insulating layer. The thickness of the second organic insulating layer is not particularly limited, but is generally preferably 1 to 10

μm. The relative dielectric constant of the second organic insulating layer is preferably 3.0 or more.

Furthermore, the first organic insulating layer and the second organic insulating layer also have a flattening function as described above, and function as a so-called flattening layer. That is, the first organic insulating layer and the second organic insulating layer can be said to be a first insulating organic planarizing layer and a second insulating organic planarizing layer, respectively.

In addition, the first organic insulating layer and the second organic insulating layer are non-pressure-sensitive adhesive. Being non-pressure-sensitive adhesive means having no pressure-sensitive adhesiveness.

(Protective Layer)

The material of the protective layer is not particularly limited, and the same materials as those described in the first organic insulating layer can be used. Further, the protective layer may be a layer formed of an inorganic compound and examples of the inorganic compound include silicon dioxide.

In addition, the thickness of the protective layer is preferably 0.1 to 10 μm.

[Method for Producing Touch Sensor]

A method for producing the touch sensor is not particularly limited, and a known production method can be used. An example of a method for producing the touch sensor will be described below. First, a decorative layer is formed on a glass substrate. A method for forming the decorative layer on the glass substrate is not particularly limited, and a known method can be used. For example, a decorative layer forming composition can be applied to a region corresponding to the peripheral region S2 and cured as necessary to form a decorative layer. Incidentally, formation of the decoration layer may be carried out as necessary.

Next, a first organic insulating layer is formed on the glass substrate so as to flatten level differences of the decorative layer. A method for forming the first organic insulating layer is not particularly limited, and a known method can be used. For example, the first organic insulating layer may be formed by applying a first organic insulating layer forming composition so as to fill a space between the decorative layers, and curing the composition as necessary. In addition to the above, a first organic insulating layer separately manufactured may be laminated so as to fill a space between the decorative layers.

Next, a first touch electrodes formed of a fine metal wire is formed on the first organic insulating layer. A method for forming the first touch electrode formed of a fine metal wire on the first organic insulating layer is not particularly limited, and a known method can be used. Examples of the method include a method in which a metal layer is formed on the first organic insulating layer, a patterned resist film is formed on the metal layer, and the metal layer is etched.

A method for forming the metal layer on the first organic insulating layer is not particularly limited, and examples thereof include a vapor phase growth method such as a sputtering method, a plasma chemical vapor deposition (CVD) method, a metal organic chemical vapor deposition (MOCVD) method, and a pulsed laser deposition (PLD) method; a liquid phase method such as a sol-gel method; organic metal decomposition methods; and an aerosol deposition method.

The etching method is not particularly limited, and a known method may be appropriately selected according to a type and the like of the material of the metal layer. Incidentally, in a case where the first touch electrode is formed, the first peripheral wirings may be formed at the same time.

Next, a second organic insulating layer is formed so as to cover the first touch electrode. A method for forming the second organic insulating layer is not particularly limited, and a known method can be used. As the method of forming the second organic insulating layer, the method described as the method of forming the first organic insulating layer can be used.

Subsequently, a second touch electrode is formed on the second organic insulating layer. A method for forming the second touch electrode is not particularly limited, and a known method can be used. As the method of forming the second touch electrode, the method already described as a method of forming the first touch electrode can be used.

Next, a protective layer is formed on the second organic insulating layer so as to cover the second touch electrode. A method for forming the protective layer on the second organic insulating layer so as to cover the second touch electrode is not particularly limited, and the same method as that for the first organic insulating layer and the second organic insulating layer can be used.

The touch sensor according to the embodiment of the present invention can be used as a touch panel by connecting a driving electronic circuit to the touch sensor. The touch panel can be used as a display device of information equipment in combination with a display device. In addition, the glass substrate of the touch sensor according to the embodiment of the present invention has a touch surface on one surface, and can thus be used as a cover glass of a display device.

EXAMPLES

Hereinafter, the present invention will be described in more detail based on Examples. The materials, the amounts of materials used, the proportions, the treatment details, the treatment procedure, or the like shown in Examples below may be modified as appropriate as long as the modifications do not depart from the spirit of the present invention. Therefore, the scope of the present invention should not be construed as being limited by Examples shown below.

Example 1

A glass substrate having a thickness of 0.7 mm was prepared. The contents of the respective atoms in the glass substrate were measured by X-ray fluorescence analysis (XRF) and quantified by a fundamental parameter (FP) method. The measurement conditions are as follows.

The analysis conditions of the X-ray fluorescence analysis (XRF) method were as follows. The quantification was performed using the fundamental parameter (FP) method.

Measuring device: ZSX100 manufactured by Rigaku Corporation

Output: Rh 50 kV-72 mA

Filter: OUT

Attenuator: 1/1

Slit: Std.

Dispersion crystal: RX25

Detector: PC

Peak angle (2θ/deg.): 47.05

Peak measurement time (sec): 40

B. G. 1 (2θ/deg.): 43.00

B. G. 1 measurement time (seconds): 20

B. G. 2 (2θ/deg.): 50.00

B. G. 2 Measurement time (seconds): 20

PHA: 110-450

Next, a decorative layer (thickness: 1.5 µm) was formed on a portion corresponding to the peripheral region on the glass substrate, and then a first organic insulating layer was formed with an acrylic resin on the glass substrate between the decorative layers. The thickness of the first organic insulating layer was 10.0 µm and the relative dielectric constant measured by the measurement method described below was 4.0. In addition, a method for measuring the relative dielectric constant of the first organic insulating layer was as follows.

A first organic insulating layer was formed on an aluminum (Al) electrode and the Al electrode was vapor-deposited on the first organic insulating layer to manufacture a sample for measuring a relative dielectric constant.

Using the sample for measuring the relative dielectric constant prepared above, an impedance at 1 MHz was measured with an impedance analyzer (4294A, Agilent) to measure a relative dielectric constant of the first organic insulating layer.

Next, a first fine metal wire is formed on the first organic insulating layer to form a first touch electrode. First, Mo was formed into a film to a thickness of 20 mm Cu was formed into a film to a thickness of 300 nm, and Mo was formed into a film to a thickness of 20 nm on the first organic insulating layer by sputtering to obtain a metal layer.

Next, a resist composition was applied onto the metal layer, prebaked, and then subjected to pattern exposure and alkali development. Thereafter, post-baking was performed to form a patterned resist film. Next, the metal layer was etched using an etching solution (hydrogen ion index (pH) of 5.23) formed by combination of 10% by mass of ammonium dihydrogen phosphate, 10% by mass of ammonium acetate, 6% by mass of hydrogen peroxide, and water as a balance, and then the resist film was peeled off with a peeling liquid to form a first touch electrode formed of the first fine metal wire. Furthermore, at this time, first peripheral wirings were also formed at the same time. As shown in FIG. 3, the first fine metal wire formed a mesh shape and the mesh pitch was 700 µm. The width and the thickness of the first fine metal wire were 3 µm (width) and 0.34 µm (thickness), respectively.

Then, a 3 µm-thick second organic insulating layer formed of an acrylic resin was formed so as to cover the first touch electrode. Next, a metal layer formed of Mo/Cu/Mo was formed on the second organic insulating layer using a sputtering method in the same manner as the first fine metal wire. Subsequently, a second fine metal wire was formed by performing the steps of resist coating, pattern exposure, development, etching, and resist peeling. As shown in FIG. 3, the second fine metal wire had a mesh shape and the mesh pitch was 700 µm. The width and the thickness of the second fine metal wire were 3 µm (width) and 0.34 µm (thickness), respectively.

Next, a protective layer (film thickness: 3 µm) formed of an acrylic resin was formed so as to cover the second fine metal wire, thereby obtaining a touch sensor.

In each of Examples and Comparative Examples other than the above, touch sensors were obtained in the same manner as in Example 1, except that the type of glass substrate used was changed. The composition of the glass substrate used was shown in Table 1.

<Touch Sensitivity>

The touch sensitivity was evaluated as follows. A driving electronic circuit was connected to the touch sensor to form a touch panel, and each of touch positions was detected while a stylus pen having a tip diameter of 2 mm was contacted with a probe robot at 10,000 predetermined positions in order on a surface of the touch panel. Then, the detection results at 10,000 positions were compared with the corresponding set values. Using the 9,973[th] value as counted from the smallest absolute value of difference vectors between the detection positions and the set positions, a sensitivity was evaluated according to the following evaluation standard. The results are shown in Table 1.

"A": The above-mentioned 9,973[th] value was less than 1.0 mm.

"B": The above-mentioned 9,973[th] value was 1.0 mm or more and less than 2.0 mm.

"C": The above-mentioned 9,973[th] value was 2.0 mm or more.

TABLE 1

| | Glass composition (% by mass) | | | | | Evaluation |
| | Al | K | Si | O | Na | Sensitivity |
| --- | --- | --- | --- | --- | --- | --- |
| Example 1 | 8.6 | 7.9 | 29.1 | 47.5 | 4.6 | A |
| Example 2 | 5.2 | 3.1 | 34.8 | 48.8 | 6.9 | B |
| Example 3 | 15.8 | 9.9 | 25.5 | 46.5 | 1.2 | B |
| Example 4 | 7.2 | 8.8 | 32.6 | 47.4 | 1.8 | A |
| Example 5 | 9.8 | 6.2 | 28.4 | 45.5 | 4.7 | A |
| Comparative Example 1 | 0.9 | 7.1 | 32.2 | 48.6 | 2.6 | C |
| Comparative Example 2 | 4.8 | 7.4 | 30.4 | 46.5 | 3.2 | C |
| Comparative Example 3 | 16.4 | 7.8 | 25.5 | 46.4 | 3.8 | C |
| Comparative Example 4 | 9.4 | 2.8 | 32.8 | 46.5 | 7.8 | C |
| Comparative Example 5 | 9.2 | 10.4 | 26.4 | 44.0 | 1.6 | C |

From the results shown in Table 1, it was found that the touch sensors of Examples 1 to 5 had excellent sensitivity. On the other hand, the touch sensors of Comparative Examples 1 to 5 did not have the effects of the present invention.

In addition, from the results shown in Table 1, the touch sensor of Example 1 in which the content of the Si atom was 28% to 33% by mass with respect to the total mass of the glass substrate, and the content of the Al atom was 7.0 to 10% by mass with respect to the total mass of the glass substrate, and the content of the K atom was 6.0% to 9.0% by mass with respect to the total mass of the glass substrate had better sensitivity, as compared to the touch sensors of Examples 2 and 3.

EXPLANATION OF REFERENCES

10, 40 touch sensor

11 glass substrate

12 first touch electrode

13 second organic insulating layer

14 second touch electrode

15 protective layer

21 first peripheral wiring

22 first external connection terminal

23 first connector unit

24 second peripheral wiring

25 second connector unit

26 second external connection terminal

31 first fine metal wire

32 second fine metal wire

41 decorative layer

42 first organic insulating layer

What is claimed is:

1. A touch sensor comprising:
   a glass substrate having a touch surface;
   a first touch electrode formed of a fine metal wire formed on a surface of the glass substrate opposite to the touch surface;
   a second organic insulating layer provided on the first touch electrode; and
   a second touch electrode formed of a fine metal wire and provided on the second organic insulating layer,
   wherein the fine metal wire of the first touch electrode forms a mesh shape,
   wherein the fine metal wire of the second touch electrode forms a mesh shape,
   wherein the second organic insulating layer has a thickness of 1 to 10 µm, and
   wherein the glass substrate contains an Si atom, an Al atom, and a K atom,
   a content of the Si atom is 25.0% to 35.0% by mass with respect to a total mass of the glass substrate,
   a content of the Al atom is 5.0% to 16.0% by mass with respect to the total mass of the glass substrate, and
   a content of the K atom is 3.0% to 10.0% by mass with respect to the total mass of the glass substrate.

2. The touch sensor according to claim 1,
   wherein the content of the Si atom is 28.0% to 33.0% by mass with respect to the total mass of the glass substrate,
   the content of the Al atom is 7.0% to 10.0% by mass with respect to the total mass of the glass substrate, and
   the content of the K atom is 6.0% to 9.0% by mass with respect to the total mass of the glass substrate.

3. The touch sensor according to claim 1, further comprising a first organic insulating layer having a relative dielectric constant of 3.0 or more between the glass substrate and the first touch electrode.

4. The touch sensor according to claim 3,
   wherein the first organic insulating layer is non-pressure-sensitive adhesive and has a thickness of 1 to 20 µm.

5. The touch sensor according to claim 1,
   wherein a mesh pitch of the fine metal wire of the first touch electrode is 400 to 1,200 µm.

6. The touch sensor according to claim 1,
   wherein the second organic insulating layer is formed of an epoxy resin or an acrylic resin.

7. The touch sensor according to claim 1,
   wherein a mesh pitch of the fine metal wire of the second touch electrode is 400 to 1,200 µm.

8. A touch panel comprising the touch sensor according to claim 1.

9. The touch sensor according to claim 2, further comprising a first organic insulating layer having a relative dielectric constant of 3.0 or more between the glass substrate and the first touch electrode.

10. The touch sensor according to claim 9,
    wherein the fine metal wire of the first touch electrode forms a mesh shape and a mesh pitch is 400 to 1,200 µm, and
    the fine metal wire of the second touch electrode forms a mesh shape and a mesh pitch is 400 to 1,200 µm.

11. The touch sensor according to claim 10,
    wherein the first organic insulating layer is non-pressure-sensitive adhesive and has a thickness of 1 to 20 µm.

12. The touch sensor according to claim 11,
    wherein the second organic insulating layer is formed of an epoxy resin or an acrylic resin.

13. A touch panel comprising the touch sensor according to claim 10.

14. A touch panel comprising the touch sensor according to claim 12.

15. The touch sensor according to claim 1,
    wherein the fine metal wire of the first touch electrode is formed from a laminate including Mo.

16. The touch sensor according to claim 15,
    wherein the fine metal wire of the second touch electrode is formed from a laminate including Mo.

* * * * *